US009192076B2

(12) United States Patent
Artman et al.

(10) Patent No.: US 9,192,076 B2
(45) Date of Patent: Nov. 17, 2015

(54) METHODS FOR MANAGING FANS WITHIN INFORMATION HANDLING SYSTEMS

(75) Inventors: Paul Artman, Austin, TX (US); Chris Everett Peterson, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 447 days.

(21) Appl. No.: 13/041,375

(22) Filed: Mar. 5, 2011

(65) Prior Publication Data

US 2012/0224322 A1     Sep. 6, 2012

(51) Int. Cl.
G05B 21/00    (2006.01)
H05K 7/20     (2006.01)
G06F 1/20     (2006.01)

(52) U.S. Cl.
CPC .............. *H05K 7/20727* (2013.01); *G06F 1/20* (2013.01); *H05K 7/20209* (2013.01)

(58) Field of Classification Search
USPC ..................................... 361/679.48; 236/49.3
See application file for complete search history.

(56) References Cited

U.S. PATENT DOCUMENTS

| 5,249,741 | A | 10/1993 | Bistline et al. |
| 5,926,386 | A | 7/1999 | Ott et al. |
| 6,257,832 | B1 | 7/2001 | Lyszkowski et al. |
| 6,319,114 | B1 * | 11/2001 | Nair et al. ..................... 454/184 |
| 6,873,883 | B2 | 3/2005 | Ziarnik |
| 7,261,661 | B2 * | 8/2007 | Schmidt ............................ 475/5 |
| 7,565,226 | B1 * | 7/2009 | Cooley et al. ................. 700/280 |
| 7,661,316 | B2 | 2/2010 | Gross et al. |
| 8,050,029 | B1 * | 11/2011 | Kam et al. ............... 361/679.49 |
| 2001/0029907 | A1 * | 10/2001 | Algrain et al. ............. 123/41.29 |
| 2008/0306633 | A1 * | 12/2008 | Tunks et al. .................. 700/300 |
| 2009/0015241 | A1 * | 1/2009 | Gross et al. .................... 324/166 |
| 2009/0099696 | A1 * | 4/2009 | Artman et al. ............... 700/276 |
| 2009/0228148 | A1 | 9/2009 | Byquist et al. |
| 2009/0304199 | A1 | 12/2009 | DeMoss |
| 2011/0090087 | A1 * | 4/2011 | Berke et al. .................... 340/584 |
| 2011/0133680 | A1 * | 6/2011 | Girard et al. .................. 318/461 |
| 2011/0206517 | A1 * | 8/2011 | Antonov et al. .......... 416/170 R |
| 2012/0078420 | A1 * | 3/2012 | Jensen et al. .................. 700/275 |
| 2013/0037250 | A1 * | 2/2013 | Franz et al. .................... 165/200 |

* cited by examiner

*Primary Examiner* — Darrin Dunn
(74) *Attorney, Agent, or Firm* — Baker Botts L.L.P.

(57) ABSTRACT

A method for managing a fan system in an information handling system (IHS) is disclosed. The method includes providing the fan system comprising a first fan and at least one subsequent fan, wherein the first fan is associated with a first fan speed, the at least one subsequent fan is associated with the at least one subsequent fan speed and the fan system is associated with a system fan speed. The method also includes generating a system fan speed request, adjusting the first fan speed to avoid a critical range when the system fan speed request falls within the critical range, and adjusting the system fan speed to meet the system fan speed request.

14 Claims, 7 Drawing Sheets

METHODS FOR MANAGING FANS WITHIN INFORMATION HANDLING SYSTEMS

TECHNICAL FIELD

The present disclosure relates generally to the field of information handling systems, and, more specifically, to fan speed management for multiple fans within information handling systems.

BACKGROUND

As the value and use of information continues to increase, individuals and businesses seek additional ways to process and store information. One option available to users is an information handling system (IHS). An information handling system generally processes, compiles, stores, and/or communicates information or data for business, personal, or other purposes thereby allowing users to take advantage of the magnitude of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for such systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Components of the IHS may consume electrical power and output most of it as heat power. Heat within an IHS may degrade or reduce the reliability of certain IHS components. An IHS may include a fan or plurality of fans, such as a fan system, to address the cooling requirements of the system.

IHS fans may be coupled to the IHS via connectors located within the IHS housing itself. Fans may serve the purpose of cooling the overall system or housing, or may serve to cool particular IHS components, such as for example, the central processing unit (CPU), the power supply unit (PSU), and/or the graphics card. As IHS power consumption has increased, so has the need for fans to remove heat within the IHS. Presently, many IHSs contain a plurality of fans. For example, a network server IHS may contain 6 or more fans to address various cooling needs. It is not uncommon to have multiple fans addressing particular components of the IHS. For example, an IHS may contain 4 or 6 fans, to cool the CPU, and 2 fans to cool the PSU.

The use of multiple fans may meet an IHS's cooling requirements, but negative consequences may result from the use of the fans. Airborne, or acoustical, noise, for example, may occur in electronic enclosures where multiple fans operate homogenously (i.e., at the same speed). Fans of similar size and/or blade geometry may interact acoustically to create unwanted noise in an IHS. This may occur whenever two or more fans are operated at the same speed, which can result in a "beating" noise that can be unpleasant for users. Additionally, there may be certain fan speeds that result in a "whistling" noise that can also be unpleasant for users. Other acoustical noise issues may include prominent tones, modulations, or buzzes, as well as sheer magnitude of fan noise.

Current fan control or management methods generally operate fans to optimize thermal performance at the lowest possible fan speed in order to reduce noise. If additional cooling is required, then current fan management methods may "jump" the range of speeds associated with known acoustical noise issues. At the higher speeds, the fans may meet the system's cooling requirements, but at the cost of higher power consumption. Other solutions for acoustical issues include fan isolation, removal of obstructions from airflow path, and/or manufacturing the IHS with differently-designed fans. These solutions pose problems for IHS layout and design. Furthermore, due to continuity of supply, the costs associated with redesigning and altering the manufacturing of the IHS may be extremely high.

Fan usage may further result in vibrations within an IHS. IHS components have become increasingly compact to offer more portable and/or space-efficient products to users. Concurrently, cost pressures on IHS manufacturing have resulted in the incorporation of potentially less robust components within some IHSs. The result has been an undesirable interaction between fan vibrations and IHS components that has impacted IHS function. In some situations, fan vibrations may interfere with the hard drive such that the hard drive cannot function optimally. In extreme cases, fan vibrations may interfere with the hard drive to such a degree that the hard drive goes offline and data is lost. During such an occurrence, fan speed limits may be imposed to prevent fans from entering speed ranges which cause vibrations that are damaging to hard drive function. However, while vibrations may be minimized under the fan speed limitations, component and ambient temperatures within the IHS may remain high at such fan speed ranges and result in less than optimal IHS function.

Conventional fan management methods may provide adequate cooling for an IHS, but generally at the cost of increased power consumption, acoustical issues and/or increased system vibration. These costs may interfere with user experience. In some cases, the cost may be so high that IHS components may not function (e.g., hard drive malfunction) properly. Thus, a need may exist for methods and systems for improving fan speed management while not compromising energy efficiency, acoustics, and component functionality.

SUMMARY

The following presents a general summary of several aspects of the disclosure in order to provide a basic understanding of at least some aspects of the disclosure. This summary is not an extensive overview of the disclosure. It is not intended to identify key or critical elements of the disclosure or to delineate the scope of the claims. The following summary merely presents some concepts of the disclosure in a general form as a prelude to the more detailed description that follows.

An aspect of the present disclosure is a method for managing a fan system in an information handling system (IHS). The method includes providing the fan system comprising a first fan and at least one subsequent fan, wherein the first fan is associated with a first fan speed, the at least one subsequent fan is associated with the at least one subsequent fan speed and the fan system is associated with a system fan speed. The methods include generating a system fan speed request, adjusting the first fan speed to avoid a critical range when the system fan speed request falls within the critical range, and adjusting the system fan speed to meet the system fan speed request.

Another aspect of the present disclosure is an information handling system (IHS) including a plurality of components for processing information and a fan system for cooling the plurality of components, wherein the fan system comprises a first fan and at least one subsequent fan, wherein the first fan is associated with a first fan speed, the at least one subsequent fan is associated with an at least one subsequent fan speed and the fan system associated with a system fan speed. The system further includes a fan system controller for controlling the fan system, wherein the controller is operable to generate a fan speed request that the system fan speed enter a critical range, adjust the first fan speed to avoid the critical range, and adjust the system fan speed to meet the fan speed request.

Yet another aspect of the present disclosure provides a fan system for cooling an information handling system (IHS). The fan system includes a plurality of fans coupled to the IHS for cooling a component of the IHS, the plurality of fans comprising a first fan and at least one subsequent fan, and a fan system controller coupled to the plurality of fans, wherein the fan system controller is operable to request a system fan speed associated with the plurality of fans to determine whether the request falls into a critical range, managing a first fan speed to avoid a critical range when the request falls within the critical range, and managing the system fan speed to meet the request.

BRIEF DESCRIPTION OF THE DRAWINGS

For detailed understanding of the present disclosure, references should be made to the following detailed description of the several aspects, taken in conjunction with the accompanying drawings, in which like elements have been given like numerals and wherein.

DETAILED DESCRIPTION

Before the present systems and methods are described, it is to be understood that this disclosure is not limited to the particular systems and methods described, as such may vary. Also, the present disclosure is not limited in its application to the details of construction, arrangement or order of components and/or steps set forth in the following description or illustrated in the figures. Thus, the disclosure is capable of other aspects, embodiments or implementations or being carried out/practiced in various other ways.

One of ordinary skill in the art should understand that the terminology used herein is for the purpose of describing possible aspects, embodiments and/or implementations only, and is not intended to limit the scope of the present disclosure which will be limited only by the appended claims. Further, use of terms such as "including", "comprising", "having", "containing", "involving", "consisting", and variations thereof are meant to encompass the listed thereafter and equivalents thereof as well as additional items.

It must also be noted that as used herein and in the appended claims, the singular forms "a," "and," and "the" may include plural referents unless the context clearly dictates otherwise. Thus, for example, reference to "a processor" refers to one or several processors and reference to "a method of adjusting" includes reference to equivalent steps and methods known to those skilled in the art, and so forth.

For purposes of this disclosure, an embodiment of an Information Handling System (IHS) may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an IHS may be a personal computer, a network storage device, or any other suitable device and may vary in size, shape, performance, functionality, and price. The IHS may include random access memory (RAM), one or more processing resources such as a central processing unit (CPU) or hardware or software control, logic, ROM, and/or other types of nonvolatile memory. Additional components of the IHS may include one or more disk drives, one or more network ports for communicating with external devices as well as various input and output (I/O) devices, such as a keyboard, a mouse, and a video display. The IHS may also include one or more buses operable to transmit data communications between the various hardware components.

Figure 1:
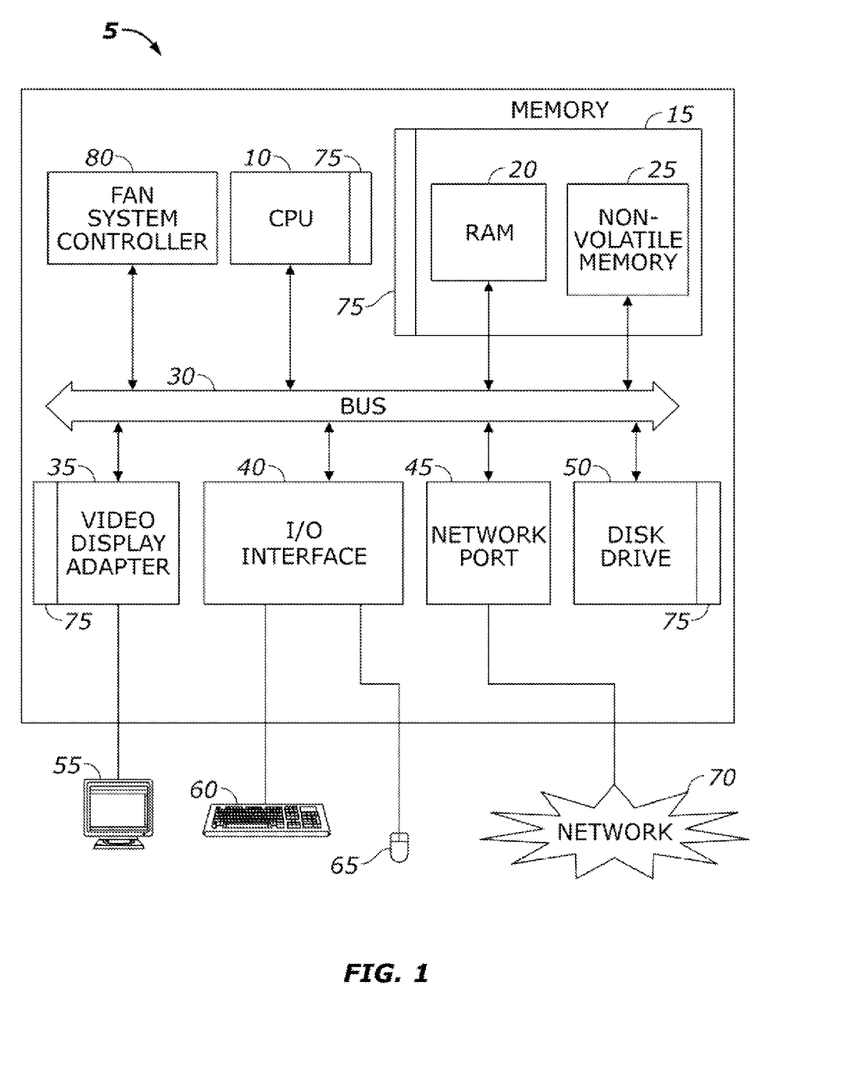
FIG. 1 represents an information handling system (IHS) in accordance with one aspect of the present disclosure.

FIG. 1 illustrates one possible implementation of an IHS 5 comprising a CPU 10. It should be understood that the present disclosure has applicability to IHSs as broadly described above, and is not intended to be limited to the IHS 5 as specifically described. The CPU 10 may comprise a processor, a microprocessor, minicomputer, or any other suitable device, including combinations and/or a plurality thereof, for executing programmed instructions. The CPU 10 may be in data communication over a local interface bus 30 with components including memory 15 and input/output interfaces 40. The memory 15, as illustrated, may include non-volatile memory 25. The non-volatile memory 25 may include, but is not limited to, firmware flash memory, non-volatile random access memory (NVRAM), and electrically erasable programmable read-only memory (EEPROM). The non-volatile memory 25 may contain a firmware program (not shown) which may contain programming and/or executable instructions required to control a keyboard 60, mouse 65, video display 55 and/or other input/output devices not shown here. This type of firmware may be known as a basic/input output system (BIOS). The memory may also comprise random access memory (RAM) 20. The operating system and application programs (e.g., graphical user interfaces) may be loaded into the RAM 20 for execution.

The IHS 5 may be implemented with a network port 45 to permit communication over a network 70 such as a local area network (LAN) or a wide area network (WAN), such as the Internet. As understood by those skilled in the art, IHS 5 implementations may also include an assortment of ports and interfaces for different peripherals and components, such as video display adapters 35, disk drives port 50, and input/output interfaces 40 (e.g., keyboard 60, mouse 65). Furthermore, the IHS may include a chassis (not shown) for IHS components, and/or a housing (not shown).

Additionally, one or more components within the IHS 5 may have a fan 75 attached. As shown, each of the components, such as the CPU 10, the memory 15, the video display adapter 35 and storage medium, including the disk drive 50, may include an attached fan 75. The fans 75 may cool each of the components by drawing warm air away from the components, drawing cooler air across the components, or moving air over the components. In some implementations, the IHS may include one or more stand-alone cooling fans (not shown).

Fans 75 may be arranged in a parallel fan configuration to result in increased airflow delivery within the IHS as compared to a serial fan configuration. In a parallel fan configuration, at least one fan 75 may be coupled such that axes or lines passing through a common center point or hub of each fan 75 are parallel to one another. Thus, in a parallel fan configuration, fans 75 may be placed adjacent to one another to provide a mechanism by which the fans 75 collectively optimize airflow delivery throughout the IHS.

Alternatively, multiple fans 75 may be arranged in a serial fan configuration. In a serial configuration, fans 75 are substantially axially aligned to result in increased pressure delivery within the IHS as compared to a parallel fan configuration. In a serial fan configuration, at least one fan 75 is coupled in a serial arrangement along a common axis or line through a common center point or hub of each fan 75. The axial alignment demonstrated by the serial fan configuration may provide a mechanism by which the fans 75 collectively optimize pressure delivery throughout the IHS.

The IHS 5 may also be implemented with or coupled to a fan system controller 80. The fan system controller 80 may contain hardware and software which enables the fan system controller 80 to operate independently of the IHS hardware (e.g., CPU 10) and software (e.g., operating system, BIOS, etc.) which controls the IHS 5. The fan system controller 80 may be electrically coupled to the local interface bus 30 in order to communicate with other components within the IHS 5. The fan system controller 80 may also be electrically coupled to a plurality of sensors (not shown), cooling fans 75, power connections, or the like, within the IHS 5 such that the fan system controller 80 may collect information related to the operating conditions of the IHS 5. Additionally, the fan system controller 80 may be electrically coupled to a reset control of the IHS 5 such that the fan system controller 80 may reset or restart the IHS 5. The fan system controller 80 may manage multiple components of the IHS 5 including and not limited to the cooling fans 75.

Additionally, the fan system controller 80 may be electrically coupled to the network port 45 within the IHS 5 to permit communication over the network 70 with a second IHS. Furthermore, the fan system controller 80 may be electrically coupled to other ports (e.g., serial port) and/or components within the IHS 5 such that the fan system controller 80 may communicate by other means with a second IHS or with a plurality of IHSs. For example, the IHS 5 may be a remotely configured IHS which is connected via the network 70 to other remotely configured IHSs or to a remote management IHS. Thus a fan system controller 80 may provide in-band, or out-of-band management of IHS components.

Figure 2:
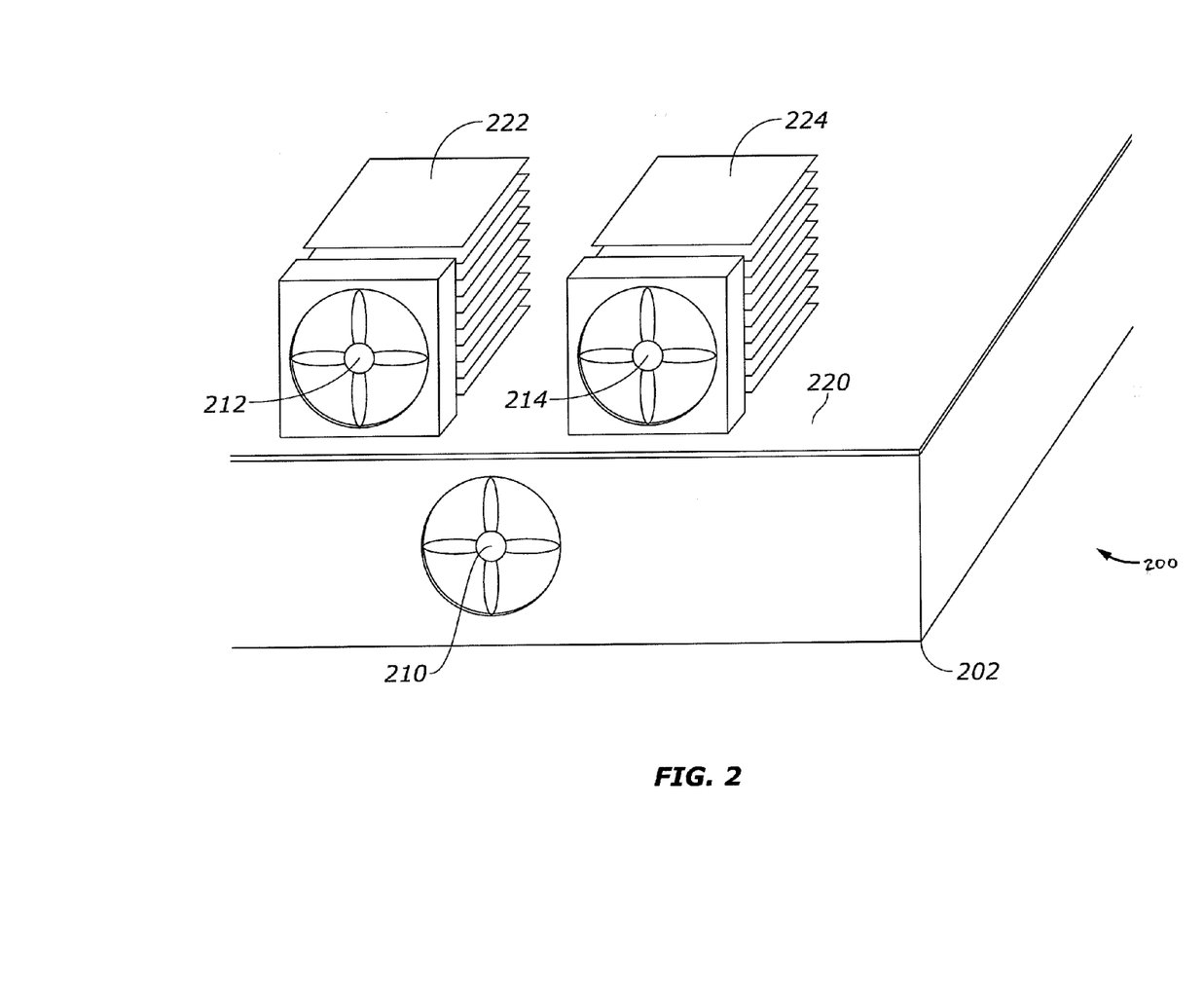
FIG. 2 represents a fan system within an IHS as shown in FIG. 1.

Referring now to FIG. 2, one implementation of a fan system 200 within an IHS 5 is shown. A fan system 200 may include fans 210, 212, 214 and a fan system controller 80 (not expressly shown in FIG. 2), as described in reference to FIG. 1. As shown, the fan system 200 may be disposed within an IHS 5. The fan system 200 may include a chassis 202. The chassis 202 may house the fan system 200, and/or other IHS 5 components. The chassis 202 may be the same chassis as that for the IHS 5, or may be a separate chassis. In FIG. 2, the chassis 202 may have disposed thereon a fan 210 that is operable to move air into and/or out of the chassis 202. Other fans 212, 214 may be disposed within the chassis 202. These fans 212, 214 may be coupled to a board 220 which may be coupled to the chassis 202. The board 220 may contain circuits (not shown) that may couple the fans to the fan system controller 80 described in FIG. 1. Adjacent to the fans 212, 214 may be heat dissipation devices 222, 224. In some implementations, the heat dissipation device 222, 224 may be a heat sink. Heat dissipation devices 222, 224 may be coupled to components of the IHS 5 that generate heat or that may become heated. As shown, heat dissipation devices 222, 224 may be located adjacent to fans 212, 214 respectively, and may assist with the cooling of various IHS components.

Figure 3:
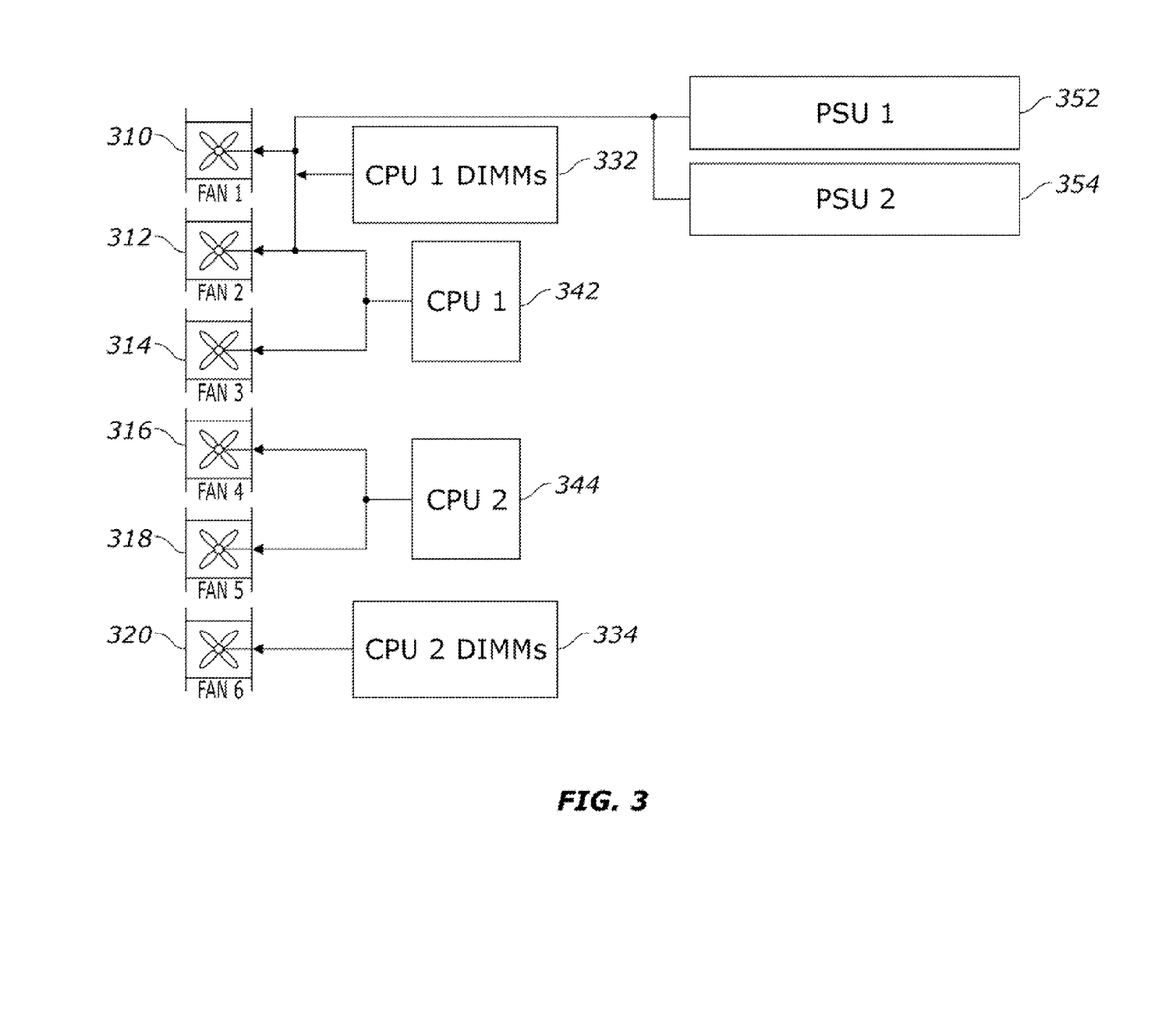
FIG. 3 provides a component-to-fan mapping for an IHS in accordance with one aspect of the present disclosure.

Referring now to FIG. 3, a component-to-fan mapping for an IHS 5 is shown. Although it is understood that an IHS 5 may include any number of fans, 6 fans 310, 312, 314, 316, 318, 320 are shown in FIG. 3. An IHS 5 may include components as described in reference to FIG. 1. Among these components may be one or more processors or CPUs 342, 344; one or more power supply units (PSUs) 352, 354; and memory such as dual inline memory modules (DIMMs) 332, 334. Each component may be mapped to one or more individual fans 310, 312, 314, 316, 318, 320. That is, each component may be cooled by multiple fans 310, 312; 314, 316, 318, 320. As shown in FIG. 3, the power supply units, PSU1 352 and PSU2 354 may be mapped to fan 1 310. Memory CPU 1 DIMMs may be mapped to fan 1 310 and fan 2 312. One central processing unit, CPU 1 342 may be mapped to fan 2 312 and fan 3 314, for example. Another central processing unit, CPU 2 344, may be mapped to fan 4 316 and fan 5 318, for example. Additional memory CPU 2 DIMMs 334 may be mapped to fan 6 320, for example. As shown, the fans 310, 312, 314, 316, 318, 320 are mapped to closed loop components. Closed loop components may be those IHS components that have known thermal requirements. A feedback system (not shown) may provide information about a closed loop component's thermal environment.

Figure 4:
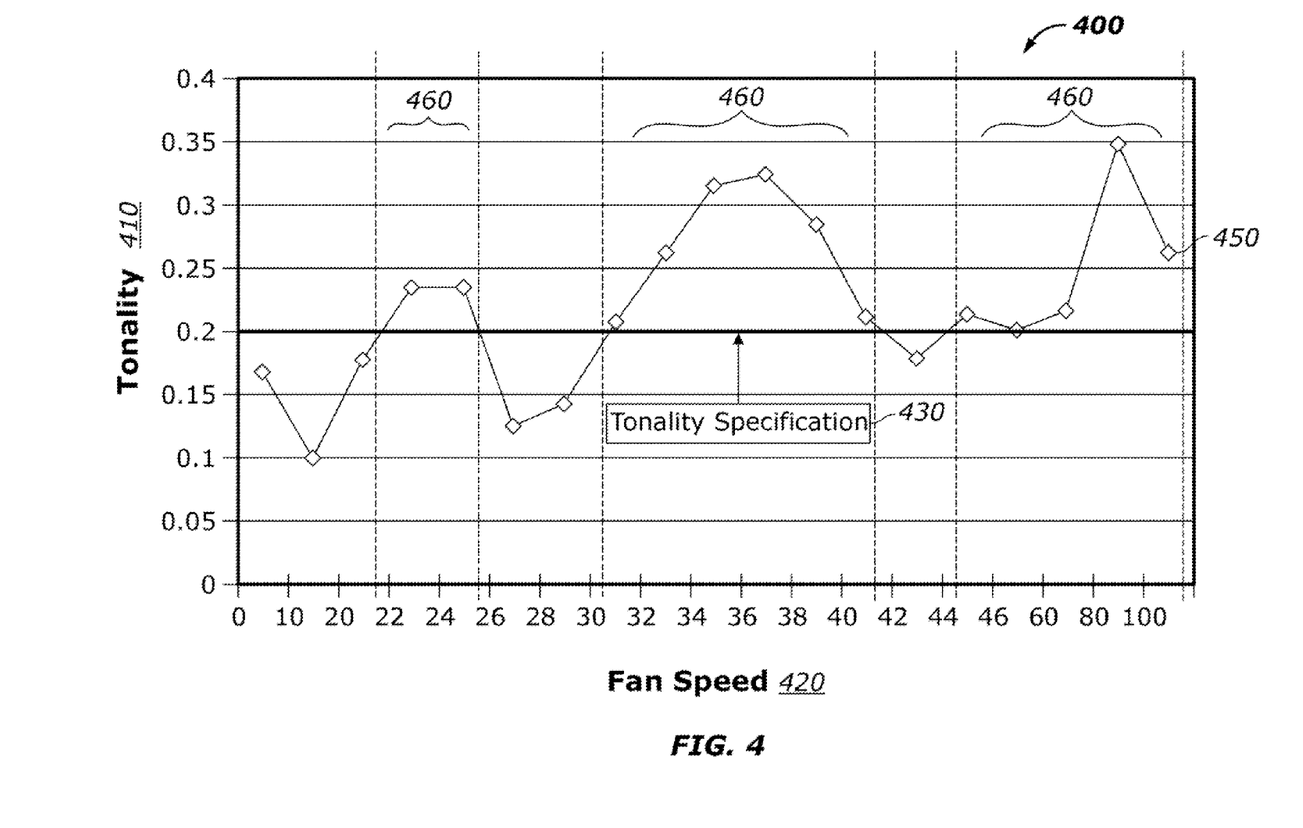
FIG. 4 provides a graph illustrating the relationship between fan speed and tonality in the IHS of FIG. 1.

Turning now to FIG. 4, a graph 400 may be provided that illustrates the relationship between fan speed 420 and tonality 410 in an IHS 5. As shown, the graph 400 may depict tonality 410 as a function of fan speed 420. In general, tonality 410 may refer to the sense of pitch of airborne noise created by a system. For instance, operating fans within or coupled to an IHS may create tones, which in turn may be measured and in aggregate referred to as tonality. Tonality 410 may be measured in various units known in the art, usually provided as a fraction or percentage energy in the tonal components to total acoustical energy. Tonality 410 may be measured by units, tu, shown ranging from 0 to 0.4. In other implementations, tonality 410 may be replaced with acoustics generally, which may refer to other airborne noises or vibrations that may affect user experience.

Fan speed 420 may be measured and indicated on the x-axis. In the graph shown, fan speed 420 may be represented by duty cycle. Duty cycle may refer to a portion of "on" time in relation to a set time period, and may be represented as a percentage. A duty cycle of 100% may refer to a fan that is fully on. In other examples, fan speed 420 may be measured by revolutions per minute (RPM).

The graph 400 may also include a threshold 430. Generally a threshold 430 may be a predetermined criterion that assists in defining a range of fan speeds 420 to be avoided. In the illustrated implementation, the threshold 430 may be a tonality threshold. A tonality threshold may refer to a predetermined criterion for tonality 410 that should be avoided. In the graph shown, the threshold 430 correlates to an airborne noise level with a tonality of 0.2 tu. Tonality measurements above 0.2 tu may be considered unpleasant to a user's experience. Thus, a tonality measuring above 0.2 tu may be above the tonality threshold 430, and should be avoided. In other implementations, the threshold 430 may be set at different tonalities and represented by different measurement units.

As depicted in FIG. 4, a tonality curve 450 may vary with fan speed 420. Notably, at certain fan speeds 420, tonality 410, may rise above the threshold 430. As show in the graph 400, the tonality curve 450 rises above the threshold 430 at fan speeds of approximately 22% to 26% duty cycle, 31% to 41% duty cycle, and above 44% duty cycle.

The graph 400 may also include a critical range or critical ranges 460. A critical range 460 may represent fan speeds 420 which should be avoided. Generally, a critical range 460 may correspond to range(s) of fan speeds associated with undesired qualities pervious mentioned herein such as acoustical issues, system noise (e.g., airborne noise), and system vibrations, for example, within an IHS. In one implementation, the critical range 460 may represent the fan speeds 420 which should be avoided in order to remain below a threshold 430. As shown, critical ranges 460 can be observed at fan speeds 420 of approximately 22% to 26% duty cycle, 31% to 41% duty cycle, and above 44% duty cycle. In other implementations, critical ranges 460 may be observed at different fan speeds 420.

As previously done, a critical range 460 may be avoided by "jumping" the critical range 460. Jumping the critical range 460 may involve increasing the fan speed 420 past the critical range 460 to the next speed on the tonality curve 450 that avoids the threshold 430. As shown in graph 400, if the critical range 460 of 31% to 41% duty cycle is the range to be jumped, then the next speed on the tonality curve 450 that avoids exceeding the tonality threshold 430 may be a fan duty cycle of 42% to 43%. Jumping the critical range 460 may address some tonality issues, at the cost of higher power consumption or creating other acoustical or vibrational issues.

Figure 5:
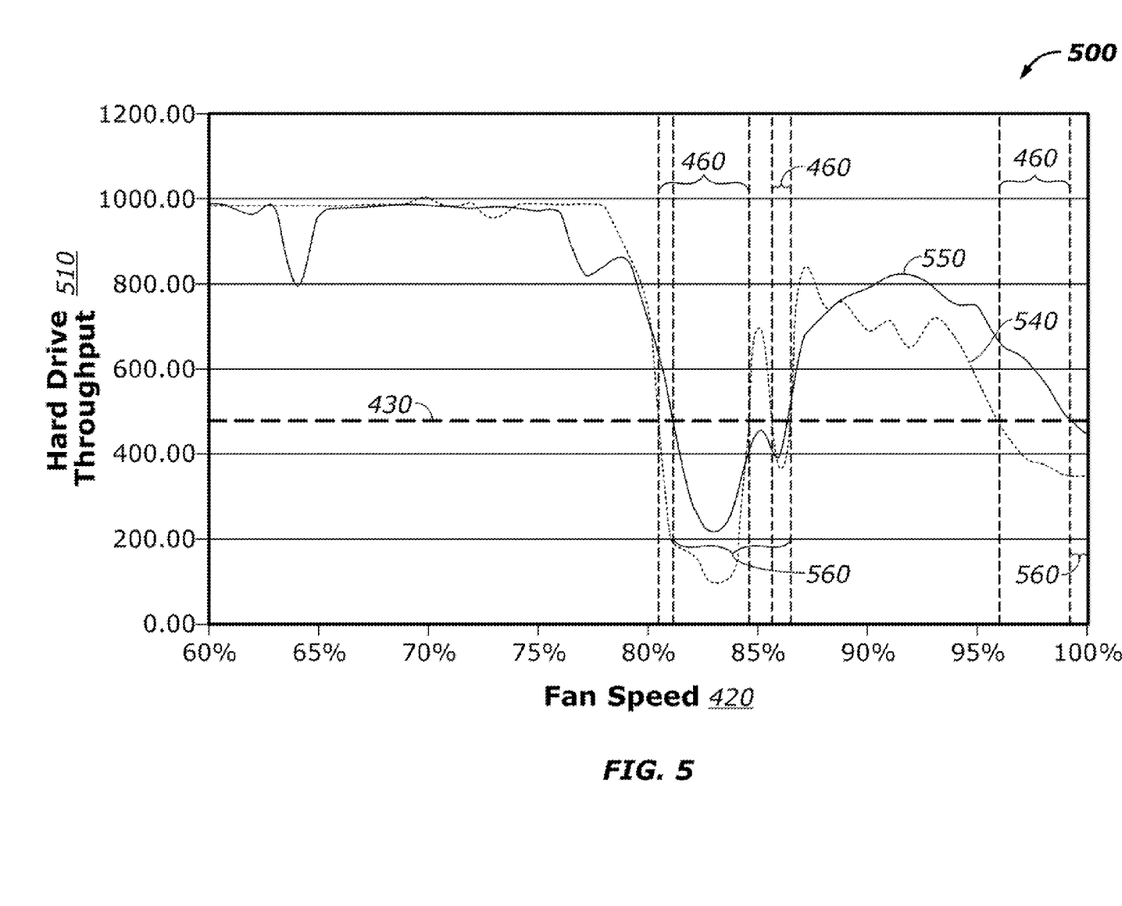
FIG. 5 provides a graph illustrating the relationship between fan speed and hard drive throughput for the IHS of FIG. 1.

Turning now to FIG. 5, the graph 500 illustrates the relationship between fan speed 420 and hard drive throughput 510 in an IHS 5. As shown, the graph 500 may depict hard drive throughput 510 as a function of fan speed 420. Fan speed 420 may be illustrated by any relevant measure of fan speed 420, as described in relation to FIG. 4. As shown in FIG. 5, fan speed 420 may be represented by pulse-width modulation (PWM). Generally, PWM may be a measurement of power to electrical devices. For example, the longer a switch is on compared to off periods, the higher the power supplied to the load. A fully on period may be expressed as 100%. Hard drive throughput 510 may describe the ability for the hard drive read/write head to read and write. Hard drive, throughput 510 may be measured as input/output per second (IOPS).

The graph 500 may also include a threshold 430. In the illustrated embodiment, the threshold 430 may be a throughput threshold. The throughput threshold may be determined based on IHS requirements. As one example, a throughput threshold may be a threshold requirement for typical hard drive functionality. As shown in FIG. 5, a threshold 430 is shown at approximately 500.00 IOPS. That is, the minimum hard drive throughput desired may be 500.00 IOPS. The throughput threshold may be determined based on exercises performed by the hard drive, such as a 64 k sequential write.

In FIG. 5, a baseline throughput curve 540 is shown as a dotted line. A baseline throughput curve 540 may represent hard drive throughput 510 across fan speeds 420 for a baseline chassis model. The baseline throughput curve 540 may generally decrease as fan speed 420 increases. At certain fan speeds 420, hard drive throughput 510 may fall below the threshold 430. As shown, the baseline throughput curve 540 falls below the threshold 430 at fan speeds 420 of approximately 81% to 85% PWM, at approximately 85% to 87% PWM, and again at fans speeds 420 above 96% PWM. The fan speed ranges 420 that correspond with a fall in hard drive throughput 510 below the threshold 430 may be referred to as critical ranges 460. The fall in throughput 510 may be attributed to vibrations of the hard drive caused by vibrations from the cooling fans. In this implementation, the critical ranges 460 may represent fan speeds 420 which should be avoided to remain above a threshold 430. In other implementations, critical ranges 460 may be observed at different fan speeds 420.

To improve hard drive throughput 510, vibrations may be limited by a modified chassis design. Modification may be a result of re-designing or retrofitting the chassis. For the graph 500, a modified chassis throughput curve 550 is shown as a solid line. The modified chassis throughput curve 550 may represent hard drive throughput 510 across fan speeds 420 for the modified chassis model. Notably, the modified chassis throughput curve 550 falls below the threshold 430 at critical ranges 460 of approximately 81% to 87% PWM, and again above 99% PWM. While the modified chassis improves hard drive throughput 510 across fan speeds 420, hard drive throughput 510 is still not optimal as large critical ranges 460 still exist. Fan speeds 420 must avoid the critical ranges 460 by either operating at speeds below the critical range 460 or "jumping" the critical range 460 and operating at speeds above the critical range 460. Operating below the critical range 460 may not provide enough cooling to meet the system's requirements. Operating above the critical range 460 may result in enhanced power consumption, acoustical problems, or other negative consequences to the IHS user's experience.

Figure 6:
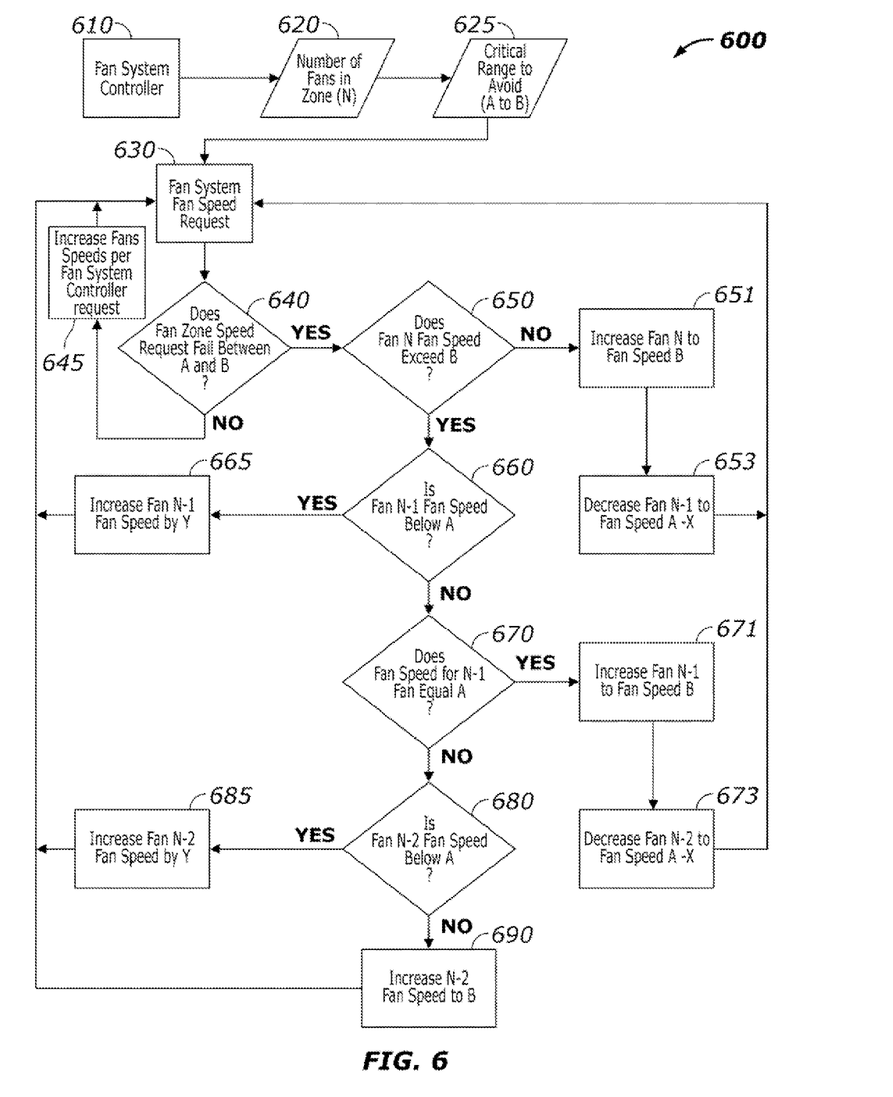
FIG. 6 provides a flow diagram that illustrates an improved method of fan speed management in accordance with one aspect of the present disclosure.

FIG. 6 provides a flow diagram 600 that illustrates a method for managing multiple fan speeds in accordance with one aspect of the present disclosure. The method 600 may be directed towards the use of a mean fan speeds, or weighting fan speeds for multiple fans to avoid a critical range. Generally, the method provides for when a fan system controller 80 generates a fan speed request that falls within a critical range 460. One fan may then increase speed to jump the critical range 460, while remaining fan(s) may decrease speed to balance system airflow. Thus, the mean fan speed may meet the fan speed request, while all or some of the fan speeds 420 avoid the critical range 460 entirely. Meeting the fan speed request may result in having a mean fan speed for all fans that are the same as or near the requested speed, or producing equivalent airflow to what would be achieved if all fans were operating at the requested fan speed. All fans should operate outside the critical range.

Referring back to FIG. 6, at step 610, the fan system controller 80 may initiate operation. The fan system controller 80 may be integrated with the IHS 5, or may be coupled to the IHS 5 and operate remotely from the IHS. At step 620, the fan system controller 80 may determine the number of fans in a system (N). N may equal any number greater than 1. A zone may be an area that includes the fans 75 operable to cool a particular component of an IHS 5, or may be an area that includes multiple components of the IHS 5. In other implementations, the zone may include all the fans 75 within an IHS 5. In some implementations, the first fan may be referred to as fan N, while subsequent fans may be referred to as fan N−1, fan N−2 and so on.

At step 625 the fan system controller 80 may determine the fan speed range corresponding to the critical range 460 to avoid (A to B, non-inclusive), wherein A may represent a low speed just outside the critical range 460 to avoid, and B may represent a high speed just outside the critical range 460 to avoid. The fan system controller 80 may determine the critical range(s) 460 based on previously stored data, based on real-time data, or based on results from empirical tests. In one implementation, the critical range 460 may be that which exceeds the tonality threshold as described in relation to FIG. 4. In another implementation, the critical range 460 may be that which falls below the throughput threshold as described in relation to FIG. 5. In yet other implementations, the critical range 460 may be determined by other measurements and based on other factors for criteria that would reduce IHS component functionality or throughput.

At step 630, the fan system controller 80, generates a fan system speed request and proceeds to manage the fans 75 and fan speeds 420. Managing of the fans may include, but is not limited to analyzing data associated with the fans 75, adjusting by increasing/decreasing fan speeds 420, monitoring the fans 75 and fan speeds 420, and checking status, regulating, and controlling the fans 75 and fan speeds 420. The request may be to increase the fan speed 420, to decrease the fan speed 420, or maintain the fan speed 420 for all the fans 75 within the zone. The request may be based on real-time data that may be available through sensors or other input devices. At step 640, the fan control system 80, determines if the fan system speed request at step 430 falls within the critical range 460 from step 625. As shown in step 645, if the fan system speed request does not fall within the critical range 460, then the fan speed 420 for all fans 75 within the zone can be increased according to the fan system speed request. If the fan system speed request falls within the critical range 460, then the method proceeds to step 650. At step 650, the fan control system 200 determines if the speed of fan N exceeds speed B that defines the upper limit of the critical range 460. If the speed of fan N does not exceed that of B, then at step 651, the fan system controller 80 increases the speed of fan N to fan speed B.

Then at step 653, the speed for fan N-1 may be decreased to fan speed A-X. X may be the speed decrease required such that the mean of fan speeds for all fans in the zone meets the fan speed request. A mean may include an arithmetic mean (simple average), a weighted mean (weighted average), or any other statistical mean calculation. The value for X may be chosen based on the appropriate mean calculation such that the mean of all fans at B and all fans at A-X equals the fan speed request. In an implementation involving a weighted mean, the weighting may depend on the type of fan or size of fan among other factors that may be considered. Notably, after step 653, fan N will not operate at a speed within the critical range 460. Fan N-1 will operate at speed A-X. In one possible implementation, A-X will be a speed outside of the critical range 460. In other implementations, A-X may be within the critical range 460. The mean speed, however, may be within the critical range 460.

At step 650, if the speed of fan N exceeds speed B, then the method proceeds to step 660. At step 660, it is determined if the speed of fan N-1 is below A. If the speed of fan N-1 is below A, then the speed of fan N-1 is increased by Y. Y may be the speed required such that the mean speed of the fans within the zone meets the fan speed request. The value for Y may be chosen based on the appropriate mean calculation such that the mean of all fan speeds over B and all fans below A but increased by Y and still lower than A equals the fan system speed request. In some implementations, the speed of fan N-1 may be within the critical range 460. In other implementations, fan speed 420 for fan N and fan speed 420 for N-1 are outside of the critical range 460.

At step 660, if the speed of fan N-1 is below A, then at step 670, it is ascertained whether the fan speed 420 for fan N-1 is equal to A. If the fan speed 420 for fan N-1 is equal to A, then at step 671, the fan speed 420 for N-1 is increased to fan speed 420 B. Then at step 673, the fan speed 420 for fan N-2 is decreased to fan speed 420 A-X. X may be the speed required such that the mean of fan speeds within the zone meets the fan speed request.

At step 670, if the fan speed 420 for N-1 does not equal A, then at step 680 it is ascertained whether the speed of fan N-2 is below A. If the fan speed 420 for fan N-2 is not below A, then the speed for fan N-2 may be increased to B at step 690. If the fan speed 420 for fan N-2 is below A, then the speed of fan N-2 is increased by Y, wherein Y may be the speed required such that the mean of fan speeds within the zone meets the fan speed request.

Figure 7:
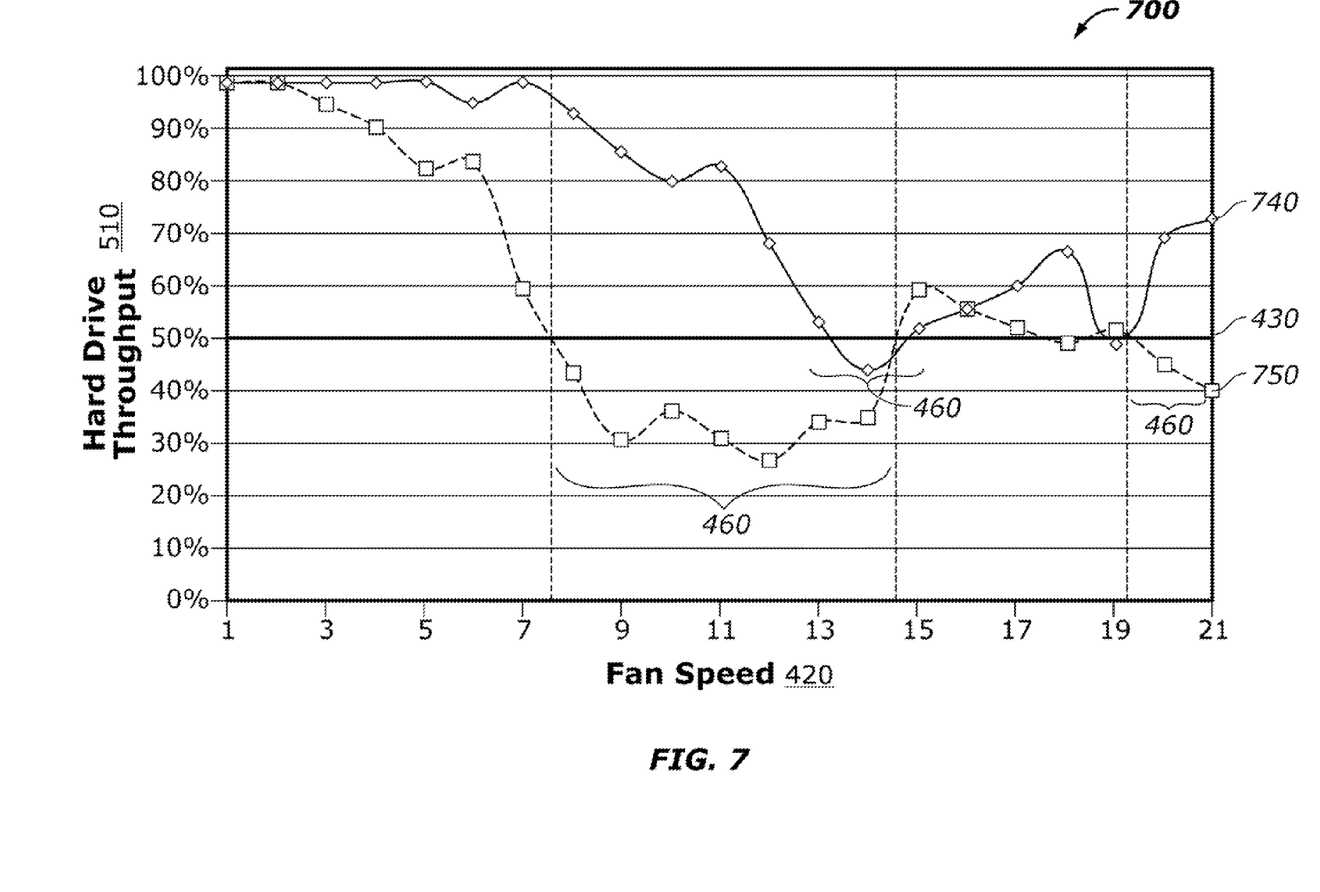
FIG. 7 provides a graph illustrating the relationship between fan speed and hard drive throughput for an IHS using conventional methods of fan speed management compared to the improved method of fan speed management.

FIG. 7 provides a graph 700 illustrating the relationship between fan speed 420 and hard drive throughput 510 for an IHS 5 using conventional methods of fan speed control compared to improved methods of fan speed control as disclosed herein. As shown, the graph 700 may depict hard drive throughput 510 as a function of fan speed 420. Hard drive throughput 510, previously described in relation to FIG. 5, is represented in this graph as duty cycle. Fan speed 420, previously described in relation to FIG. 4, is also represented in this graph as duty cycle. The graph 700 illustrates a segment of the duty cycle for fan speed 420 from 1% to 21%. As shown, units for fan speed may be fan speed PWM increase from baseline settings.

The graph 700 may also include a threshold 430. In the illustrated implementation, the threshold 430 may be a throughput threshold, which may be approximately equivalent to the threshold 430 in FIG. 5. The threshold 430 of the present implementation is 50% throughput 510, and may represent a predetermined throughput requirement for IHS function.

As depicted in FIG. 7, a throughput curve 750 may generally decrease as fan speed 420 increases. At certain fan speeds 420, the baseline throughput curve 750 may fall below the threshold 530, indicating critical ranges 460 that should be avoided. As shown, critical ranges 460 may exist for the baseline throughput curve 750 at approximately 8% to 15% duty cycle, and again at 20% to 21% above the initial baseline fan speeds for unweighted fan speeds.

The graph 700 may also include an improved throughput curve 740. The improved throughput curve 740 may represent hard drive throughput 510 across fan speeds 420 for fans 75 operating using the method described in reference to FIG. 6. The improved throughput curve 740 may generally descend as fan speed 420 increases. However, throughput 510 descends at a slower rate compared to the baseline throughput curve 750. The improved throughput curve 740 falls below the threshold 430 at a fan speed range of approximately 13% to 15% above the baseline weighted fan speed, which may indicate a critical range 460. Notably, the critical range 460 for the improved throughput curve 740 may be significantly less than the critical ranges 460 for the baseline throughput curve 750. The graph 700 may indicate that the method of fan speed management described in reference to FIG. 6 enables hard drive throughput 510 to avoid a threshold 430 at a wider range of fan speeds 420 than using conventional methods of fan speed management.

The baseline throughput curve 750 may depict a fan speed curve in the case of all fans such that x=1 represents 73%, x=2 represents 74%, . . . x=21 represents 93%. Alternatively, the improved throughput curve 740 may depict a fan speed curve for two sets of fan operating at the same time at different speeds. In the case of two fans, x=1 represents 80%, x=2 represents 81%, . . . x=21 represents 100%. The remaining fans (e.g., N−1 fans) may be x=1 represents 70%, x=2 represents 71%, . . . x=21 represents 90%.

To illustrate one possible example, at point x=11, along the baseline throughput curve 750, all fans may be at 83% PWM duty cycle, corresponding to approximately 30% throughput. At the same point x=11, along the improved throughput curve 740 corresponding to a 6-fan systems, 2 fans may be at 90% PWM duty cycle and the remaining 4 fans may be at 80% PWM duty cycle and approximately 80% throughput.

Use of the method for fan management as described in the present disclosure may reduce power consumption, and diminish acoustical issues and/or system vibration. A fan speed controller 80 may make a fan speed request for a fan speed 420 that is associated with detrimental impact (i.e., critical ranges 460) on an IHS. By increasing the speed of some fans 75 while decreasing the speed of other fans 75 to avoid critical ranges 460, a mean fan speed can be achieved. The mean fan speed may fulfill the IHS or IHS component's cooling requirements, while conserving power and diminishing the likelihood of detrimental acoustics or vibrations.

Furthermore, methods of the present disclosure, detailed description and claims may be presented in terms of logic, modules (e.g., performance adjustment module), software or software implemented aspects typically encoded on a variety of storage media or storage medium including, but not limited to, computer-readable storage medium/media, machine-readable storage medium/media, program storage medium/media or computer program product. Such storage media, having computer-executable instructions stored thereon, may be handled, read, sensed and/or interpreted by an information handling system, such as a computer. Generally, computer-executable instructions, such as program modules, may include routines, programs, objects, components, data structures, and the like, which perform particular tasks, carry out particular methods or implement particular abstract data types. Those skilled in the art will appreciate that such storage media may take various forms such as cards, tapes, magnetic disks (e.g., floppy disk or hard drive) and optical disks (e.g., compact disk read only memory ("CD-ROM") or digital versatile disc ("DVD")). It should be understood that the given implementations are illustrative only and shall not limit the present disclosure.

Although the present disclosure has been described with reference to particular examples, embodiments and/or implementations, those skilled in the art will recognize that modifications and variations may be made without departing from the spirit and scope of the claimed subject matter. Such changes in form and detail, including use of equivalent functional and/or structural substitutes for elements described herein, fall within the scope of the appended claims and are intended to be covered by this disclosure.

What is claimed is:

1. A method for managing a fan system in an information handling system (IHS), the method comprising:
    providing a fan system comprising:
        a first fan associated with a first fan speed; and
        a second fan associated with a second fan speed, wherein the second fan speed is different from the first fan speed; and
        wherein the fan system is associated with a system fan speed comprising a mean of the first fan speed and the second fan speed;
    identifying a first critical range of fan speeds at which a tonality exceeds a predetermined tonality threshold, the predetermined tonality threshold being one of a plurality of tonalities of airborne noise produced by the fan system;
    identifying a second critical range of fan speeds at which a hard drive throughput falls below a predetermined hard drive throughput threshold based on fan vibrations;
    generating a system fan speed request;
    adjusting the first fan speed to avoid the first critical range and the second critical range when the system fan speed request falls within the first critical range or the second critical range;
    managing the second fan speed to avoid the first critical range and the second critical range; and
    adjusting the system fan speed to meet the system fan speed request.

2. The method of claim 1, wherein the system fan speed comprises a weighted mean of the first fan speed and the second fan speed.

3. The method of claim 1, wherein the system fan speed comprises an arithmetic mean of the first fan speed and the second fan speed.

4. The method of claim 1, wherein the fan system is controlled remotely from the IHS.

5. The method of claim 1, wherein the first fan speed is increased to avoid the first critical range.

6. The method of claim 5, wherein the second fan speed is decreased to allow the system fan speed to meet the system fan speed request.

7. An information handling system (IHS) comprising:
    a plurality of components for processing information;
    a fan system for cooling the plurality of components, comprising:
        a first fan associated with a first fan speed; and
        a second fan associated with a second fan speed, wherein the second fan speed is different than the first fan speed; and
        wherein the fan system is associated with a system fan speed comprising a mean of the first fan speed and the second fan speed; and
    a fan system controller for controlling the fan system, wherein the controller is operable to:
        identify a first critical range of fan speeds at which a tonality exceeds a predetermined tonality threshold, the predetermined tonality threshold being one of a plurality of tonalities of airborne noise produced by the fan system;
        identify a second critical range of fan speeds at which a hard drive throughput falls below a predetermined hard drive throughput threshold based on fan vibrations;
        generate a fan speed request;
        adjust the first fan speed to avoid the first critical range and the second critical range;
        manage the second fan speed to avoid the first critical range and the second critical range; and
        adjust the system fan speed to meet the fan speed request.

8. The system of claim 7 wherein the first fan speed is increased to avoid the first critical range.

9. The system of claim 8 wherein second fan speed is decreased to allow the system fan speed to meet the system fan speed request.

10. The system of claim 7 wherein the system fan speed comprises a weighted mean of the first fan speed and the second fan speed.

11. A fan system for cooling an information handling system (IHS), the fan system comprising:

a plurality of fans coupled to the IHS for cooling a component of the IHS, the plurality of fans comprising:
  a first fan associated with a first fan speed; and
  a second fan associated with a second fan speed, wherein the second fan speed is different from the first fan speed; and
  wherein the plurality of fans is associated with a system fan speed comprising a mean of the first fan speed and the second fan speed; and
a fan system controller coupled to the plurality of fans, wherein the fan system controller is operable to:
  generate a system fan speed request associated with the plurality of fans;
  identify a first critical range of fan speeds at which a tonality exceeds a predetermined tonality threshold, the predetermined tonality threshold being one of a plurality of tonalities of airborne noise produced by the fan system;
  identify a second critical range of fan speeds at which a hard drive throughput falls below a predetermined hard drive throughput threshold based on fan vibrations;
  determine whether the request falls into the critical range;
  adjust the first fan speed to avoid the first critical range and the second critical range when the system fan speed request falls within the first critical range or the second critical range;
  manage the second fan speed to avoid the first critical range and the second critical range; and
  adjust the system fan speed to meet the request.

12. The system of claim 11 wherein the fan system controller operates remotely from the IHS.

13. The system of claim 11 wherein the first fan speed is increased to avoid the first critical range.

14. The system of claim 11 wherein the system fan speed comprises a weighted mean of the first fan speed and the second fan speed.

* * * * *